United States Patent
Majhi et al.

(10) Patent No.: US 10,516,104 B2
(45) Date of Patent: Dec. 24, 2019

(54) HIGH RETENTION RESISTIVE RANDOM ACCESS MEMORY

(71) Applicant: Intel Corporation, Santa Clara, CA (US)

(72) Inventors: Prashant Majhi, San Jose, CA (US); Elijah V. Karpov, Santa Clara, CA (US); Uday Shah, Portland, OR (US); Ravi Pillarisetty, Portland, OR (US); Niloy Mukherjee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,571

(22) PCT Filed: Sep. 25, 2015

(86) PCT No.: PCT/US2015/052203
§ 371 (c)(1),
(2) Date: Feb. 27, 2018

(87) PCT Pub. No.: WO2017/052584
PCT Pub. Date: Mar. 30, 2017

(65) Prior Publication Data
US 2018/0309054 A1    Oct. 25, 2018

(51) Int. Cl.
*G11C 13/00*    (2006.01)
*H01L 45/00*    (2006.01)

(52) U.S. Cl.
CPC .......... *H01L 45/08* (2013.01); *G11C 13/0007* (2013.01); *H01L 45/1233* (2013.01);
(Continued)

(58) Field of Classification Search
CPC ... H01L 45/08; H01L 45/1233; H01L 45/145; H01L 45/146; H01L 45/147;
(Continued)

(56) References Cited

U.S. PATENT DOCUMENTS

2008/0135834 A1    6/2008   Kaza et al.
2009/0039336 A1    2/2009   Terao et al.
(Continued)

FOREIGN PATENT DOCUMENTS

CN    101364634    7/2008

OTHER PUBLICATIONS

The International Searching Authority, Written Opinion of the International Searching Authority and the International Search Report dated Jul. 8, 2016 in International Application No. PCT/US2015/052203.

(Continued)

*Primary Examiner* — Didarul A Mazumder
(74) *Attorney, Agent, or Firm* — Trop, Pruner & Hu, P.C.

(57) ABSTRACT

An embodiment includes a memory comprising: a top electrode and a bottom electrode; an oxygen exchange layer (OEL) between the top and bottom electrodes; a first oxide layer between the OEL and the bottom electrode; and a second oxide layer between the first oxide layer and the bottom electrode; wherein (a) a first plurality of oxygen vacancies are within the first oxide layer and are adjacent the OEL at a first concentration, (b) a second plurality of oxygen vacancies are within the first oxide layer and are adjacent the second oxide layer at a second concentration that is less than the first concentration, and (c) the first oxide layer includes a first oxide material different from a second oxide material included in the second oxide layer. Other embodiments are described herein.

8 Claims, 3 Drawing Sheets

(52) U.S. Cl.
CPC .......... *H01L 45/145* (2013.01); *H01L 45/146* (2013.01); *H01L 45/147* (2013.01); *H01L 45/1666* (2013.01); *G11C 2213/32* (2013.01); *G11C 2213/51* (2013.01)

(58) Field of Classification Search
CPC ............ H01L 45/1666; G11C 13/0007; G11C 2213/32; G11C 2213/51
USPC ........................................................... 257/4
See application file for complete search history.

(56) References Cited

U.S. PATENT DOCUMENTS

| | | | | |
|---|---|---|---|---|
| 2009/0057737 | A1* | 3/2009 | Boescke | H01L 21/28291 257/295 |
| 2010/0002491 | A1 | 1/2010 | Hwang et al. | |
| 2011/0149634 | A1* | 6/2011 | Schloss | G11C 13/0007 365/148 |
| 2011/0291066 | A1* | 12/2011 | Baek | H01L 45/08 257/4 |
| 2013/0121060 | A1* | 5/2013 | Lee | G11C 11/5685 365/148 |
| 2013/0344649 | A1 | 12/2013 | Gallo | |
| 2014/0145135 | A1 | 5/2014 | Gee et al. | |
| 2014/0185358 | A1 | 7/2014 | Jo et al. | |
| 2014/0264238 | A1* | 9/2014 | Jo | H01L 45/08 257/4 |
| 2015/0083989 | A1* | 3/2015 | Ode | H01L 27/11206 257/4 |
| 2016/0049584 | A1* | 2/2016 | Dang | H01L 45/08 257/4 |

OTHER PUBLICATIONS

Taiwanese Patent Office, Office Action dated Sep. 9, 2019 and Search Report in Taiwanese patent application No. 105126251, 9 pages.

* cited by examiner

HIGH RETENTION RESISTIVE RANDOM ACCESS MEMORY

TECHNICAL FIELD

Embodiments of the invention are in the field of semiconductor devices and, in particular, non-volatile memory.

BACKGROUND

Resistive random access memory (RRAM or ReRAM) relies on a class of materials that switch in a one-time event from a virgin insulating state to a low resistive state by way of a "forming" event. In the forming event, the device goes through "soft breakdown" in which a localized filament forms in a dielectric layer located between two electrodes. This filament shunts current through the filament to form a low resistance state. The RRAM switches from a low to a high resistive state (by disbanding the filament) and from a high to a low resistive state (by reforming the filament) by applying voltages of different polarities to the electrodes to switch the state. Thus, conventional RRAM can serve as a memory.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figures 1, 2:
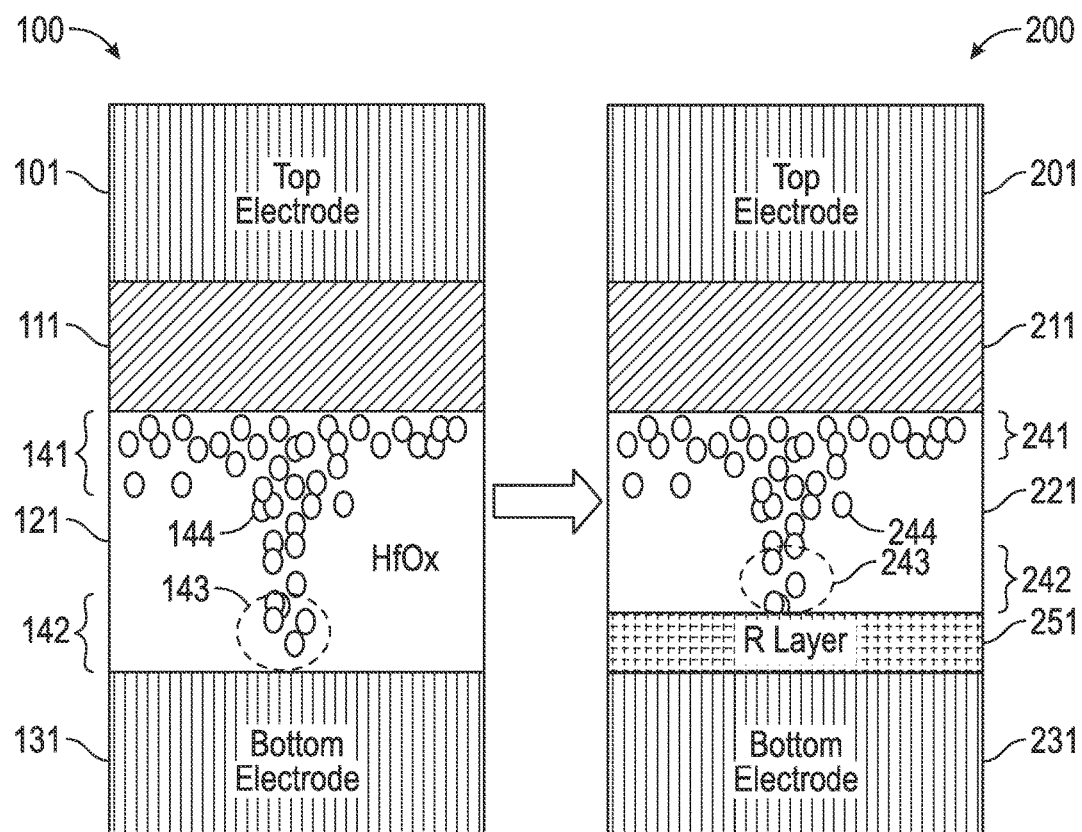
FIG. 1 includes a conventional RRAM stack.
FIG. 2 includes a RRAM stack in an embodiment of the invention.

FIG. 1 includes a conventional RRAM stack 100 including top electrode 101, oxygen exchange layer (OEL) 111 (e.g., Hf, Ti, and the like), oxide 121 (e.g., HfOx), and bottom electrode 131. Oxygen vacancies 144 have a higher concentration in region 141 and a relatively lower concentration in region 142. The vacancies collectively form a filament that serves as a memory. As addressed above, a "soft breakdown" occurs whereby, for example, an anneal takes place such that oxygen is scavenged by OEL 111 thereby producing vacancies 144. The vacancies cluster near the OEL/oxide interface (interface between layers 111 and 121) because that is where the scavenging takes place. Biasing electrodes 101, 131 with one polarity may purposely remove vacancies in area 143 to disband or disrupt the filament and create a high resistance state (a "0" memory state). Reversing the bias to electrodes 101, 131 with an opposite polarity may reform vacancies in area 143 to reform the filament and create a low resistance state (a "1" memory state).

Applicant determined the "1" state is at times not "retained" as the vacancies disband over time once bias is removed from electrodes 101, 131. As such, any memory based on stack 100 is unstable—a quality undesirable for non-volatile memories.

However, Applicant has addressed the retention issue. FIG. 2 includes an embodiment of an RRAM memory thin film stack with improved reliability and switching properties. In particular, the interface area 243 between the electrode and oxide (where the memory switching occurs) is augmented with another oxide thin film 251 that provides for high retention (of the filament oxygen vacancies) properties. Such an embodiment improves the reliability of filamentary based RRAM memory and makes the memory more suitable for, as an example, embedded nonvolatile memory.

FIG. 2 includes RRAM memory stack 200 comprising top electrode 201, bottom electrode 231, OEL 211, first oxide layer 221, and second oxide layer 251. A first plurality of oxygen vacancies 241 are adjacent the OEL at a first concentration and a second plurality of oxygen vacancies 242 are adjacent the second oxide layer at a second concentration that is less than the first concentration. "Adjacent" or "immediately adjacent", as used herein, are relative terms. Thus, vacancies 242 are adjacent layer 251 but not layer 211 and vacancies 241 are adjacent layer 211 but not layer 251.

In an embodiment the first oxide layer 221 includes a first oxide material different from a second oxide material included in the second oxide layer 251.

For example, in an embodiment OEL 211 includes a metal such as one or more of the following: Copper (Cu), Hafnium (Hf), Titanium (Ti), Ruthenium (Ru), Aluminum (Al), and Silver (Ag).

In an embodiment, the second oxide layer 251 includes at least one of HfSiOx, HfAlOx, SiO2, MgOx, LaAlOx, LaSiOx, and GdSiOx. In an embodiment the first oxide layer 221 includes at least one of HfO2, SiO2, Al2O3, TiO2, SrTiO3, Cr—SrTiO3, NiO, CuOx, ZrO2, Nb2O5, MgO, Fe2O3, Ta2O5, ZnO, CoO, CuMnOx, CuMoOx, InZnO, Cr—SrZrO3, PrCaMnO3, SrLaTiO3, LaSrFeO3, (Pr,Ca)MnO3, Nb—SrTiO3, and LaSrCoO3. In an embodiment top electrode 201 includes at least one of Hf, Ti, Ta, Pd, W, Mo, and Pt and the bottom electrode 231 includes at least one of Hf, Ti, Ta, Pd, W, Mo, and Pt. Additionally, electrodes 201, 231 may include multiple layers of materials with differing properties.

Layer 251 promotes retention by stabilizing vacancy 244 migration. Conventionally vacancies at area 143 migrate into and are/or a consumed by bottom electrode 131 and may also disperse into oxide 121. However, layer 251 removes holes or locations to which vacancies 244 may otherwise migrate, thereby limiting migration/consumption of vacancies to within oxide 221. In an embodiment layer 251 is 1-10 nm thick and may be stoichiometric.

In an embodiment, the second oxide layer 251 directly contacts the first oxide layer 221 to provide stability for the vacancies 244 located in regions 242 and 243. In an embodiment the first oxide layer 221 directly contacts the OEL 211 to allow for scavenging of oxygen from oxide layer 221 and the resultant creation of vacancies 244.

RRAM stack 200 is a functioning nonvolatile memory in that in a first state (when energy is applied to the top electrode at a first polarity) the first and second pluralities of oxygen vacancies form a first filament having a first electrical resistance; and in a second state (when energy is applied to the top electrode at a second polarity, which is opposite the first polarity) the first and second pluralities of oxygen vacancies form a different filament configuration or discontinuity thereby causing the higher resistivity.

In the second state the second plurality of oxygen vacancies 242 is at a low concentration (second concentration) and in the first state the second plurality of oxygen vacancies 242 is at a concentration that is greater than the second concentration.

Figures 3A, 3B, 3C, 3D, 3E:
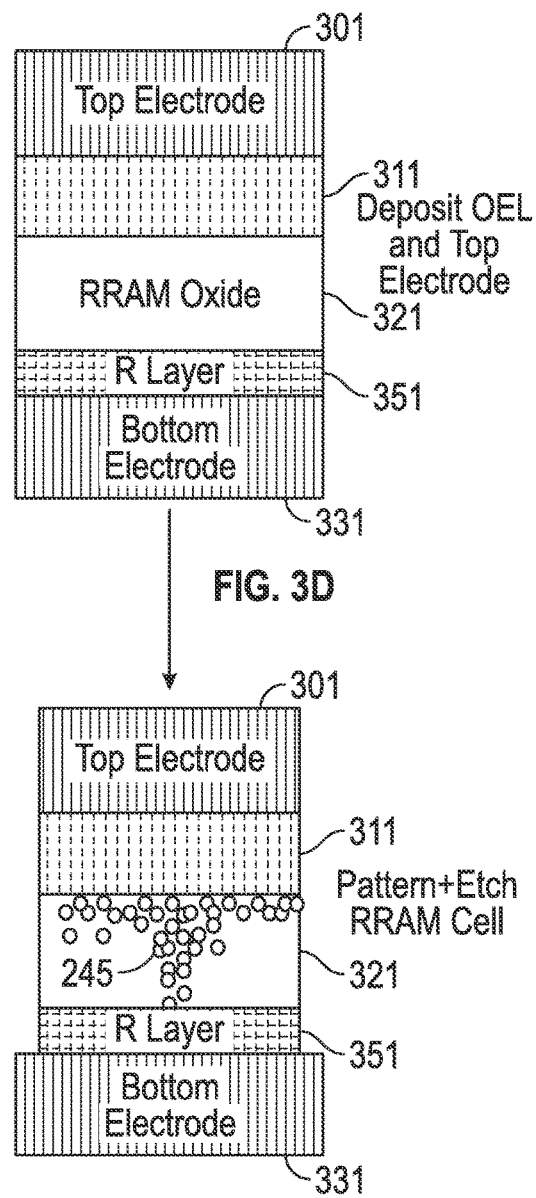
FIGS. 3a-3e include a method of forming a RRAM stack in an embodiment of the invention.

FIGS. 3*a*-3*e* include a method of forming a RRAM stack in an embodiment of the invention. In FIG. 3*a* the bottom electrode 331 is formed. In FIG. 3*b* the "retention" or "R" layer 351 is deposited (e.g., chemical vapor deposition, atomic layer deposition) on the bottom electrode. Next oxide 321 is formed (FIG. 3*c*) followed by OEL 311 and top electrode 301 (FIG. 3*d*). Finally, patterning and etching occur to form the RRAM cell and an anneal is performed to produce filament 245 composed of oxygen vacancies (FIG. 3*e*).

Various embodiments disclosed herein have addressed RRAM stacks. Any such RRAM stack may be used in a memory cell by coupling one portion or node of the stack (e.g., top electrode of FIG. 1B) to a bit-line and another node of the stack (e.g., bottom electrode of FIG. 1B) to a source or drain node of a switching device, such as a selection transistor. The other of the source and drain node of the selection transistor may be coupled to a source line of the memory cell. The gate of the selection transistor may couple to a word-line. Such a memory cell may utilize resistance to store memory states. Embodiments provide smaller and more power efficient memory cells that can be scaled below, for example, 22 nm CD. The RRAM stack may couple to a sense amplifier. A plurality of the RRAM memory cells may be operably connected to one another to form a memory array, wherein the memory array can be incorporated into a non-volatile memory device. It is to be understood that the selection transistor may be connected to the top electrode or the bottom electrode of a RRAM stack.

Figure 4:
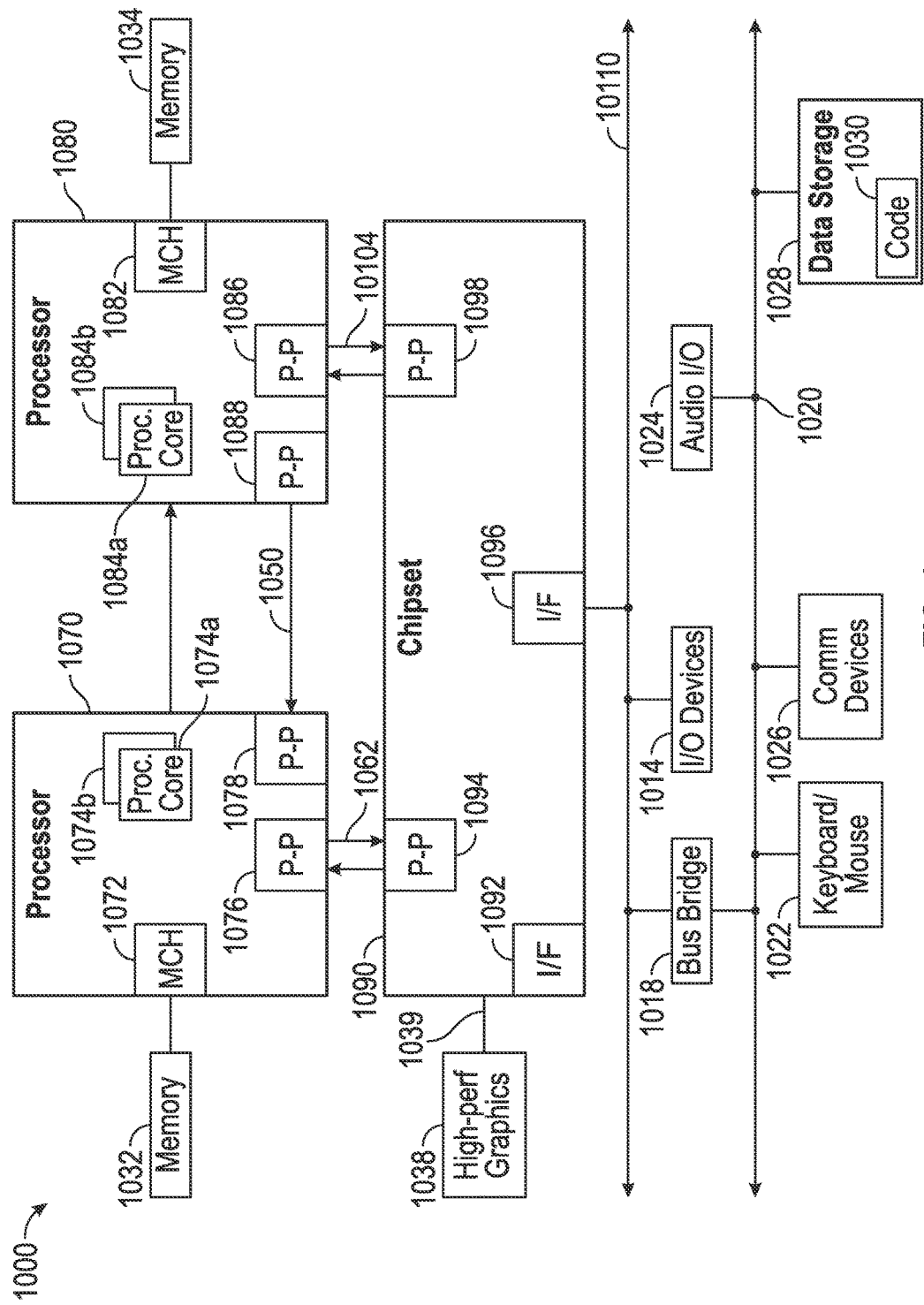
FIG. 4 includes a system including an embodiment of the RRAM stack.

FIG. 4 includes a system that may include any of the above described embodiments. FIG. 4 includes a block diagram of a system embodiment 1000 in accordance with an embodiment of the present invention. System 1000 may include hundreds or thousands of the above described memory cells/stacks (stack 200 of FIG. 2) and be critical to memory functions in system 1000. System 1000 may be included in, for example, a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer memory state storage in a broader range of operating temperatures) to such computing nodes.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074*a* and 1074*b* and processor cores 1084*a* and 1084*b*). Such cores 1074, 1074*b*, 1084*a*, 1084*b* may be configured to execute instruction code.

Each processing element 1070, 1080 may include at least one shared cache or memory unit which may include memory stacks described herein. The shared cache may store data (e.g., instructions) that are utilized by one or more components of the processor, such as the cores 1074*a*, 1074*b* and 1084*a*, 1084*b*, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. Memory 1032, 1024 may include memory stacks described herein. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device (which may include the RRAM stacks described herein) which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 4 may alternatively be partitioned using more or fewer integrated chips than shown in the FIG. 4. For example, a field programmable gate array may share a single wafer with a processor element and memory including MTJs described herein.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a memory comprising: a top electrode and a bottom electrode; an oxygen exchange layer (OEL) between the top and bottom electrodes; a first oxide layer between the OEL and the bottom electrode; and a second oxide layer between the first oxide layer and the bottom electrode; wherein (a) a first plurality of oxygen vacancies are within the first oxide layer adjacent the OEL at a first concentration, (b) a second plurality of oxygen vacancies are within the first oxide layer and adjacent the second oxide layer at a second concentration that is less than the first concentration, and (c) the first oxide layer includes a first oxide material different from a second oxide material included in the second oxide layer.

"Top" and "bottom" are relative terms and may change based on the orientation of the stack. OEL is a term of art known to those of ordinary skill in the art. The OEL may also be referred to as a "metal cap layer". The OEL may include a metal such that, when the OEL is adjacent or contacting an oxygen source (e.g., oxide layer), the OEL facilitates "oxygen exchange" with the oxygen source. In an embodiment, OEL 211 may include substoichiometric oxide or metal that is not fully oxidized. By saying "the first oxide layer includes a first oxide material different from a second oxide material included in the second oxide layer" the first oxide material may include Hf while the second oxide material includes Al or the first oxide material may include HfOx while the second oxide material includes HfSiOx. Also, a term like SiOx and the like is shorthand and includes instances such as $SiO_2$.

In example 2 the subject matter of the Example 1 can optionally include wherein the second oxide layer directly contacts the first oxide layer.

The direct contact may preclude barrier layers and the like such that second oxide layer, such as "R" layer 251, can prevent dispersal or general degradation of a filament with vacancies in an area such as area 243.

In example 3 the subject matter of the Examples 1-2 can optionally include wherein the first oxide layer directly contacts the OEL.

The direct contact may preclude barrier layers and the like such that oxygen exchange between OEL and the first oxide is uninhibited.

In example 4 the subject matter of the Examples 1-3 can optionally include wherein the memory is a resistive random access memory (RRAM).

In an embodiment the second oxide layer need not be continuous from one side of the RRAM to the other side of the RRAM. For example, the top electrode is vertically oriented over the bottom electrode. The second oxide layer is formed with a long axis in the horizontal plane orthogonal to a vertical axis that intersects the top and bottom electrodes. The second oxide layer may not be continuous and uninterrupted extending across the entire horizontal plane but may instead have one or more discontinuities which may be filled with a material, such as the first oxide layer. One of the one or more discontinuities may be centrally located between two sidewalls of the second layer (where the sidewalls extend vertically to couple the electrodes to each other) but in other embodiments the one or more discontinuities may be offset to one of the sidewalls.

In example 5 the subject matter of the Examples 1-4 can optionally include wherein the OEL includes a metal.

The OEL metal may include Hf, Ti, Ta, Er, Gd or other reactive metals with high oxygen affinity.

In example 6 the subject matter of the Examples 1-5 can optionally include wherein the metal includes at least one member selected from the group comprising: Copper (Cu), Hafnium (Hf), Titanium (Ti), Ruthenium (Ru), Aluminum (Al), and Silver (Ag).

Another version of example 6 includes the subject matter of the Examples 1-5 wherein the metal includes at least one member selected from the group comprising: Hafnium (Hf), Titanium (Ti), Tantalum (Ta), Erbium (Er), and Gadolinium (Gd).

In example 7 the subject matter of the Examples 1-6 can optionally include wherein the second oxide layer includes at least one material selected from the group comprising HfSiOx, HfAlOx, SiO$_2$, MgOx, LaAlOx, LaSiOx, and GdSiOx.

Another version of example 7 includes the subject matter of the Examples 1-6 can optionally include wherein the first oxide layer includes at least one of HfO$_x$, SiO$_x$, Al$_2$O$_x$, TiOx, TaOx, GdOx, ErOx, NbOx, WOx, ZnOx, and InGaZnOx.

In example 8 the subject matter of the Examples 1-7 can optionally include wherein the first oxide layer includes at least one of HfO$_2$, SiO$_2$, Al$_2$O$_3$, TiO$_2$, SrTiO$_3$, Cr—SrTiO$_3$, NiO, CuOx, ZrO$_2$, Nb$_2$O$_5$, MgO, Fe$_2$O$_3$, Ta$_2$O$_5$, ZnO, CoO, CuMnOx, CuMoOx, InZnO, Cr—SrZrO$_3$, PrCaMnO$_3$, SrLaTiO$_3$, LaSrFeO$_3$, (Pr,Ca)MnO$_3$, Nb—SrTiO$_3$, and LaSrCoO$_3$.

In example 9 the subject matter of the Examples 1-8 can optionally include wherein the top electrode includes at least one member selected from the group comprising Hf, Ti, Ta, Pd, W, Mo, and Pt and the bottom electrode includes at least one member selected from the group comprising Hf, Ti, Ta, Pd, W, Mo, and Pt.

In an embodiment the top and bottom electrodes include different materials. In an embodiment, the "top" electrode may be a metal or alloy of metals (TiN, TaN, W, Ru, Ir, TiAlN, or other good barrier materials) while the "bottom" electrode is a high workfunction metal" (W, Pd, Pt, Ru, Mo, TiN or other high work function metal).

Another version of example 9 includes the subject matter of the Examples 1-8 can optionally include wherein the top electrode includes at least one member selected from the group comprising TiN, TaN, W, Ru, Ir, TiAlN, and TaAlN while the bottom electrode is selected from the group comprising W, Pd, Pt, Ru, Mo, and TiN.

In example 10 the subject matter of the Examples 1-9 can optionally include wherein the second oxide material includes a doped instance of the first oxide material.

For example, the first oxide material may include HfOx while the second oxide material includes HfSiOx.

In example 11 the subject matter of the Examples 1-10 can optionally include wherein the second oxide layer includes at least one material selected from the group comprising HfSiOx, HfAlOx, SiOx, MgOx, LaAlOx, LaSiOx, and GdSiOx.

In example 12 the subject matter of the Examples 1-11 can optionally include wherein the first plurality of oxygen vacancies are immediately adjacent the OEL and the second plurality of oxygen vacancies are immediately adjacent the second oxide layer.

By "immediately adjacent" some of the vacancies may be in direct contact with the OEL.

In example 13 the subject matter of the Examples 1-12 can optionally include wherein: in a first state when energy is applied to the top electrode at a first polarity the first and second pluralities of oxygen vacancies form a first filament having a first electrical resistance; and in a second state when energy is applied to the top electrode at a second polarity, which is opposite the first polarity, the first and second pluralities of oxygen vacancies form a second filament having a second electrical resistance that is greater than the first electrical resistance.

In example 14 the subject matter of the Examples 1-13 can optionally include wherein in the second state the second plurality of oxygen vacancies is at the second concentration and in the first state the second plurality of oxygen vacancies is at an additional concentration that is greater than the second concentration.

In example 15 the subject matter of the Examples 1-14 can optionally include wherein: in a first state when energy is applied to the top electrode at a first polarity the first and second pluralities of oxygen vacancies form a first filament having a first electrical resistance; and in a second state when energy is applied to the top electrode at a second polarity, which is opposite the first polarity, the first and second pluralities of oxygen vacancies form a path between the top and bottom electrodes having a second electrical resistance that is greater than the first electrical resistance.

The second electrical resistance may be very high when the path is incomplete due to an absence of vacancies at area 243.

In example 16 the subject matter of the Examples 1-15 can optionally include a system comprising: a processor; a memory, coupled to the processor, according to any one of examples 1 to 14; and a communication module, coupled to the processor, to communicate with a computing node external to the system.

Another example includes a method comprising: forming an oxide layer on a bottom electrode, another oxide layer on the oxide layer, an OEL on the another oxide layer, and a top electrode on the OEL. The method may further include annealing the stack to form a filament comprising oxygen vacancies.

Example 17 includes a resistive random access memory (RRAM) comprising: a top electrode and a bottom electrode; a first oxide layer between the top and bottom electrodes; and a second layer, between the first oxide layer and the bottom electrode, comprising at least one of an oxide and a nitride; wherein (a) a first plurality of oxygen vacancies are within the first oxide layer, are closer to the top electrode than the bottom electrode, and are at a first concentration, (b) a second plurality of oxygen vacancies are within the first oxide layer and are adjacent the second layer, between the first plurality of oxygen vacancies and the second layer, at a second concentration that is less than the first concentration, and (c) the first oxide layer includes a first oxide material different from a second material included in the second layer.

In example 18 the subject matter of Examples 17 can optionally include wherein the second layer directly contacts the first oxide layer.

In example 19 the subject matter of the Examples 17-18 can optionally include wherein the second layer includes at least one of SiN and AlN.

In example 20 the subject matter of the Examples 17-19 can optionally include wherein: in a first state when energy is applied to the top electrode at a first polarity the first and second pluralities of oxygen vacancies form a first filament having a first electrical resistance; and in a second state when energy is applied to the top electrode at a second polarity, which is opposite the first polarity, the first and second pluralities of oxygen vacancies form a second filament having a second electrical resistance that is greater than the first electrical resistance.

Example 21 includes a semiconductor processing method comprising forming a bottom electrode; forming a second oxide layer on the bottom electrode; forming a first oxide layer on the second oxide layer; forming an oxygen exchange layer (OEL) on the first oxide layer; forming a top electrode on the OEL; patterning the first and second oxide layers and the OEL to form a resistive random access memory (RRAM) cell; and annealing the RRAM cell to produce a filament, composed of oxygen vacancies, in the first oxide layer.

In example 22 the subject matter of the Example 21 can optionally include wherein the second oxide layer directly contacts the first oxide layer.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A resistive memory comprising:
a top electrode and a bottom electrode;
an oxygen exchange layer (OEL) between the top and bottom electrodes;
a first oxide layer between the OEL and the bottom electrode; and
a second oxide layer between the first oxide layer and the bottom electrode;
wherein (a) a first plurality of oxygen vacancies are within the first oxide layer and are adjacent the OEL at a first concentration, (b) a second plurality of oxygen vacancies are within the first oxide layer and are adjacent the second oxide layer at a second concentration that is less than the first concentration, (c) the first oxide layer includes a first oxide material different from a second oxide material included in the second oxide layer, and (d) the OEL includes a metal;
wherein (a) the second oxide layer directly contacts the first oxide layer; (b) the first oxide layer directly contacts the OEL; (c) the metal includes at least one of Hafnium (Hf), Titanium (Ti), Tantalum (Ta), Erbium (Er), Gadolinium (Gd) or combinations thereof; and (d) the first oxide material includes at least one of $HfO_x$, $SiOX$, $Al_2O_x$, $TiO_x$, $TaO_x$, $GdO_x$, $ErO_x$, $NbO_x$, $WO_x$, $ZnO_x$, $InGaZnO_x$, or combinations thereof, and (e) the second oxide material includes a doped instance of the first oxide material, the doped instance of the first oxide material including at least one of $HfSiO_x$, $HfAlO_x$, $MgO_x$, $LaAlO_x$, $LaSiO_x$, $GdSiO_x$, or combinations thereof.

2. The memory of claim 1, wherein the memory is a resistive random access memory (RRAM).

3. The memory of claim 1, wherein the top electrode includes at least one of TiN, TaN, W, Ru, Ir, TiAlN, TaAlN or combinations thereof while the bottom electrode includes at least one of W, Pd, Pt, Ru, Mo, TiN, or combinations thereof.

4. The memory of claim 1, wherein the first plurality of oxygen vacancies are immediately adjacent the OEL and the second plurality of oxygen vacancies are immediately adjacent the second oxide layer.

5. The memory of claim 1, wherein:
in a first state when energy is applied to the top electrode at a first polarity the first and second pluralities of oxygen vacancies form a first filament having a first electrical resistance; and
in a second state when energy is applied to the top electrode at a second polarity, which is opposite the first polarity, the first and second pluralities of oxygen vacancies form a second filament having a second electrical resistance that is greater than the first electrical resistance.

6. The memory of claim 5, wherein in the second state the second plurality of oxygen vacancies is at the second concentration and in the first state the second plurality of oxygen vacancies is at an additional concentration that is greater than the second concentration.

7. The memory of claim 1, wherein:
in a first state when energy is applied to the top electrode at a first polarity the first and second pluralities of oxygen vacancies form a first filament having a first electrical resistance; and
in a second state when energy is applied to the top electrode at a second polarity, which is opposite the first polarity, the first and second pluralities of oxygen vacancies form a path between the top and bottom electrodes having a second electrical resistance that is greater than the first electrical resistance.

8. A system comprising:
a processor;
the memory, coupled to the processor, according to claim 1; and
a communication module, coupled to the processor, to communicate with a computing node external to the system.

* * * * *